United States Patent
Hwang et al.

(10) Patent No.: US 10,153,255 B2
(45) Date of Patent: Dec. 11, 2018

(54) SEMICONDUCTOR PACKAGE HAVING A HIGH RELIABILITY

(71) Applicant: SAMSUNG ELECTRONICS CO., LTD., Suwon-si, Gyeonggi-Do (KR)

(72) Inventors: Ji-Hwan Hwang, Hwaseong-si (KR); Sang-Sick Park, Seoul (KR); Tae-Hong Min, Hwaseong-si (KR); Geol Nam, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/439,321

(22) Filed: Feb. 22, 2017

(65) Prior Publication Data
US 2017/0243857 A1    Aug. 24, 2017

(30) Foreign Application Priority Data
Feb. 22, 2016   (KR) .................. 10-2016-0020695

(51) Int. Cl.
*H01L 25/00*      (2006.01)
*H01L 25/065*     (2006.01)
(Continued)

(52) U.S. Cl.
CPC ...... *H01L 25/0657* (2013.01); *H01L 25/0655* (2013.01); *H01L 25/105* (2013.01); *H01L 25/50* (2013.01); *H01L 21/563* (2013.01); *H01L 23/3128* (2013.01); *H01L 2224/8385* (2013.01); *H01L 2225/06513* (2013.01); *H01L 2225/06541* (2013.01); *H01L 2225/06555* (2013.01); *H01L 2225/06565* (2013.01);
(Continued)

(58) Field of Classification Search
CPC .................................................. H01L 25/0657
See application file for complete search history.

(56) References Cited

U.S. PATENT DOCUMENTS 5,889,332 A * 3/1999 Lawson ............... H01L 21/563
257/668
8,450,150 B2  5/2013 Maki et al.
(Continued)

FOREIGN PATENT DOCUMENTS

JP    2012-222038    11/2012
JP    2013-033952    2/2013
(Continued)

*Primary Examiner* — William Harriston
(74) *Attorney, Agent, or Firm* — F. Chau & Associates, LLC

(57) ABSTRACT

A semiconductor package includes a package substrate, a plurality of semiconductor devices stacked on the package substrate, a plurality of underfill fillets disposed between the plurality of semiconductor devices and between the package substrate and the plurality of semiconductor devices, and a molding resin at least partially surrounding the plurality of semiconductor devices and the plurality of underfill fillets. The plurality of underfill fillets include a plurality of protrusions that protrude from spaces between each of the plurality of semiconductor devices or between the package substrate and each of the plurality of semiconductor devices. At least two neighboring underfill fillet protrusions of the plurality of protrusions form one continuous structure without an interface therebetween.

19 Claims, 24 Drawing Sheets

(51) Int. Cl.
*H01L 25/10* (2006.01)
*H01L 23/31* (2006.01)
*H01L 21/56* (2006.01)

(52) U.S. Cl.
CPC ............... *H01L 2225/06582* (2013.01); *H01L 2225/06586* (2013.01); *H01L 2225/1023* (2013.01); *H01L 2225/1058* (2013.01)

(56) References Cited

U.S. PATENT DOCUMENTS

| | | |
|---|---|---|
| 9,123,830 B2 | 9/2015 | Nakamura et al. |
| 2006/0284298 A1 | 12/2006 | Kim et al. |
| 2012/0228762 A1* | 9/2012 | Fukuda ................ H01L 21/563 257/737 |
| 2015/0194410 A1 | 7/2015 | Nam |

FOREIGN PATENT DOCUMENTS

| | | |
|---|---|---|
| JP | 2013-225642 | 10/2013 |
| JP | 2014-056954 | 3/2014 |
| JP | 2015-026638 | 2/2015 |

\* cited by examiner

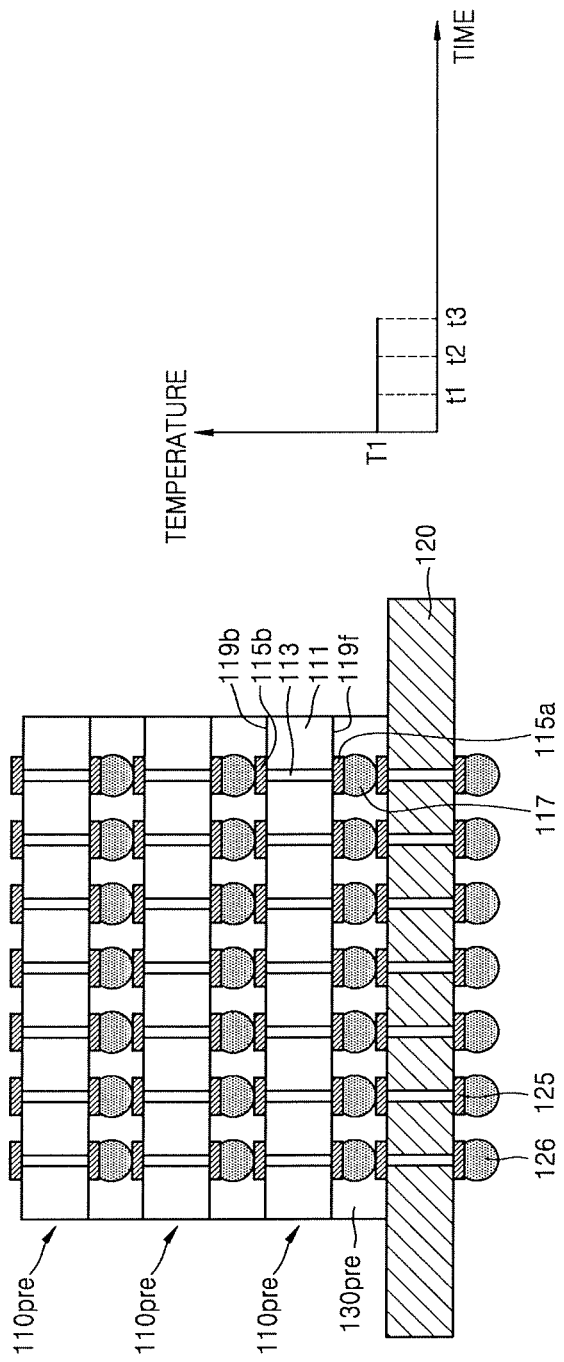

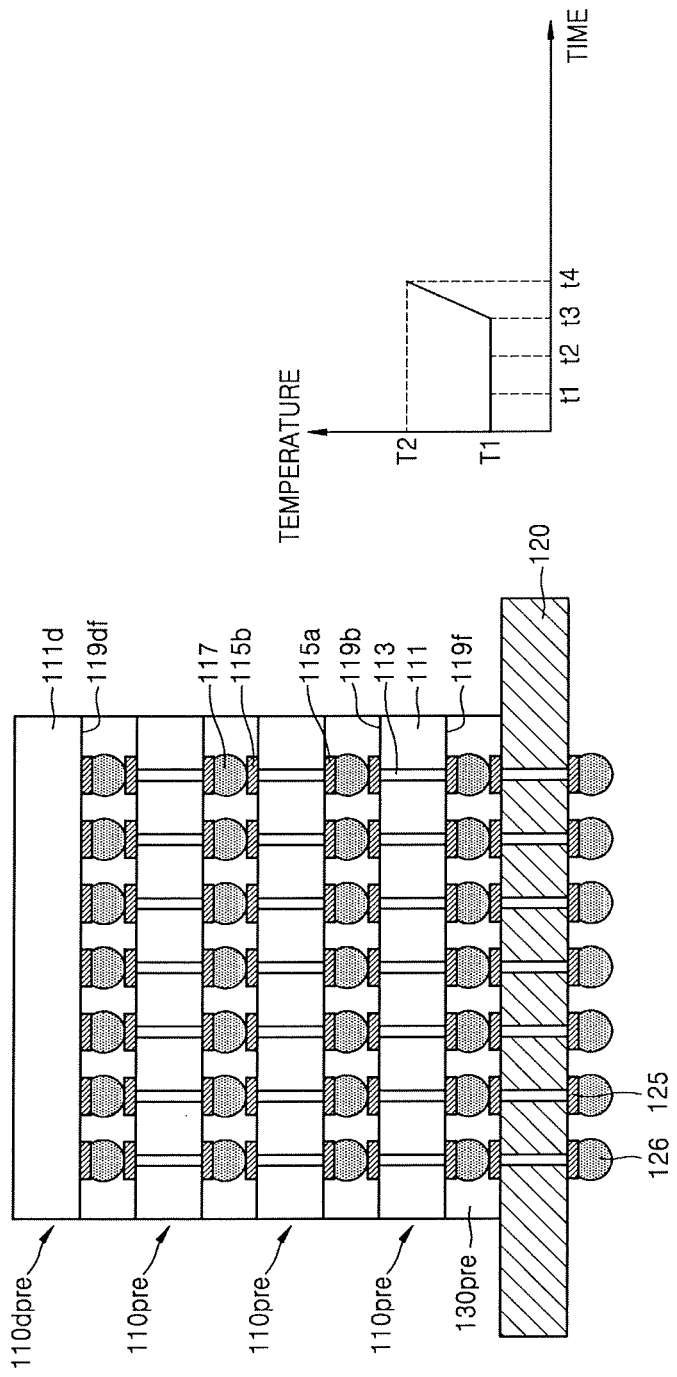

US 10,153,255 B2

SEMICONDUCTOR PACKAGE HAVING A HIGH RELIABILITY

CROSS-REFERENCE TO RELATED APPLICATION

This application claims priority under 35 U.S.C. § 119 to Korean Patent Application No. 10-2016-0020695, filed on Feb. 22, 2016, in the Korean Intellectual Property Office, the disclosure of which is incorporated by reference herein in its entirety.

TECHNICAL FIELD

The inventive concept relates to a semiconductor package, and more particularly, to a semiconductor package having a high reliability.

DISCUSSION OF THE RELATED ART

Recently semiconductor chips, for example, memory chips, are becoming highly integrated. Research is being performed on methods of stacking the highly integrated semiconductor chips.

SUMMARY

The inventive concept provides a semiconductor package having a high reliability and a low production cost.

In an exemplary embodiment of the inventive concept, a semiconductor package includes a package substrate, a plurality of semiconductor devices stacked on the package substrate, a plurality of underfill fillets disposed between the plurality of semiconductor devices and between the package substrate and the plurality of semiconductor devices, and a molding resin at least partially surrounding the plurality of semiconductor devices and the plurality of underfill fillets. The plurality of underfill fillets include a plurality of protrusions that protrude from spaces between each of the plurality of semiconductor devices or between the package substrate and each of the plurality of semiconductor devices. At least two neighboring underfill fillet protrusions of the plurality of protrusions form one continuous structure without an interface therebetween.

In an exemplary embodiment of the inventive concept, a semiconductor package includes a package substrate, a plurality of semiconductor devices stacked on the package substrate, a plurality of underfill fillets disposed between the plurality of semiconductor devices and between the package substrate and the plurality of semiconductor devices, and a molding resin surrounding the plurality of semiconductor devices and the plurality of underfill fillets. Intervals between the plurality of semiconductor devices, and between the package substrate and the plurality of semiconductor devices get smaller for semiconductor devices further away from the package substrate.

In an exemplary embodiment of the inventive concept, a semiconductor package includes a package substrate, a first semiconductor device and a second semiconductor device stacked on the package substrate, wherein the first semiconductor device is disposed between the package substrate and the second semiconductor device, a first underfill fillet disposed between the package substrate and the first semiconductor device and a second underfill fillet disposed between the first semiconductor device and the second semiconductor device, and a molding resin covering at least a part of each of the first and second underfill fillets. The first underfill fillet protrudes from an area between the package substrate and the first semiconductor device, the second underfill fillet protrudes from an area between the first semiconductor device and the second semiconductor device. The protrusion of the first underfill fillet forms one continuous structure with the protrusion of the second underfill fillet.

BRIEF DESCRIPTION OF THE DRAWINGS

The above and other features of the inventive concept will become more apparent by describing in detail exemplary embodiments thereof in conjunction with the accompanying drawings, in which:

FIGS. 11A through 11G are cross-sectional views for sequentially illustrating a method of manufacturing a semiconductor package according to an exemplary embodiment of the inventive concept;

DETAILED DESCRIPTION OF THE EMBODIMENTS

Figure 1A:
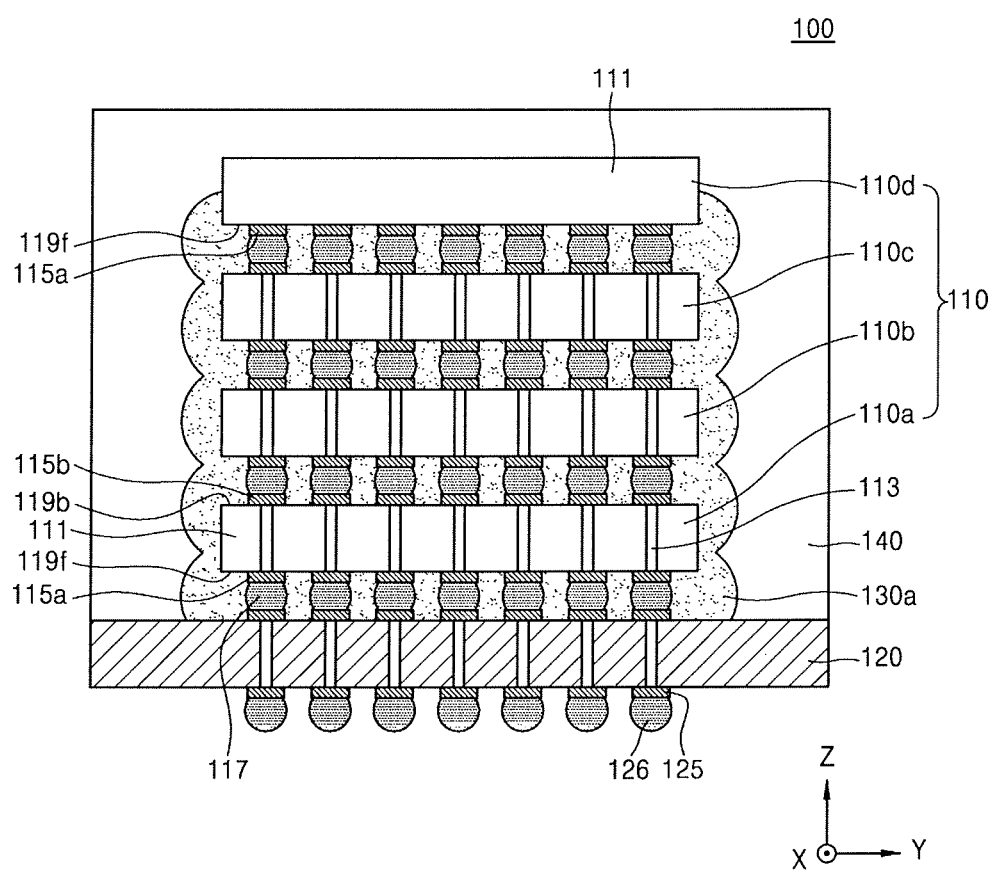
FIG. 1A is a cross-sectional view of a semiconductor package according to an exemplary embodiment of the inventive concept.

Hereinafter, exemplary embodiments of the inventive concept will be described in detail with reference to the accompanying drawings. It should be understood that the inventive concept is not limited to the following embodiments and may be embodied in different ways. Like reference numerals may refer to like elements throughout the specification. In the drawings, the widths, lengths, thicknesses, and the like, of components or elements may be exaggerated for clarity.

As used herein, the singular terms "a," "an" and "the" are may include the plural forms as well, unless the context clearly indicates otherwise.

FIG. 1A is a cross-sectional view of a semiconductor package 100 according to an exemplary embodiment of the inventive concept.

Referring to FIG. 1A, a plurality of semiconductor devices 110 may be stacked on a package substrate 120. Underfill fillets 130a may be present between the plurality of semiconductor devices 110 and between the package substrate 120 and the plurality of semiconductor devices 110.

The semiconductor substrate 120 may be, for example, a printed circuit board (PCB) substrate, a ceramic substrate, or an interposer. When the package substrate 120 is a PCB, the package substrate 120 may include a substrate base, and an upper pad and a lower pad that may be respectively formed on an upper surface and a lower surface of the substrate base. The upper pad and the lower pad may be exposed by a solder resist layer covering an upper surface and a lower surface of the substrate base. The substrate base may include phenol resin, epoxy resin, and/or polyimide. For example, the substrate base may include FR4, tetrafunctional epoxy, polyphenylene ether, epoxy/polyphenylene oxide, bismaleimide triazine (BT), thermount, cyanate ester, polyimide, and/or liquid crystal polymer. The upper pad and the lower pad may include copper, nickel, stainless steel, or beryllium copper. An internal wiring electrically connecting the upper pad and the lower pad may be formed in the substrate base. The upper pad the lower pad may be exposed by the solder resist layer. The upper pad the lower pad may be parts of a circuit wiring formed by patterning a copper (Cu) foil on the upper surface and the lower surface of the substrate base.

When the package substrate 120 is an interposer, the package substrate 120 may include a substrate base including a semiconductor material, and an upper pad and a lower pad that may be respectively formed on an upper surface and a lower surface of the substrate base. The substrate base may include, for example, a silicon wafer. Internal wiring may be formed on the upper surface, the lower surface, or inside of the substrate base. A through via electrically connecting the upper pad and the lower pad may be formed inside the substrate base.

An external connection terminal 126 may be attached onto a lower surface of the package substrate 120. The external connection terminal 126 may be attached onto a lower pad 125. The external connection terminal 126 may be, for example, a solder ball or a bump. The external connection terminal 126 may electrically connect the semiconductor package 100 to an external device.

The plurality of semiconductor devices 110 may include one or more semiconductor chips. In an exemplary embodiment of the inventive concept, the plurality of semiconductor devices 110 may include one or more semiconductor sub packages. The plurality of semiconductor devices 110 may include four semiconductor devices 110a, 110b, 110c, and 110d in FIG. 1A, but the inventive concept is not limited thereto. For example, more than four semiconductor devices 100 may be stacked on each other, or less than four semiconductor devices may be stacked on each other.

The semiconductor device 110d that is uppermost among the plurality of semiconductor devices 110, e.g., the farthest away from the package substrate 120, may be stacked in a flip chip way. The semiconductor device 110d may be integrated with (e.g., include) semiconductor devices, for example, transistors, in an active surface 119f of the semiconductor device 110d. A plurality of bonding pads 115a may be provided on the active surface 119f. The plurality of bonding pads 115a may conform to guidelines, for example, the JEDEC standard. In addition, each of the plurality of bonding pads 115a may have a thickness of several hundred nanometers (nm) to several micrometers (m). The plurality of bonding pads 115a may include Al, Cu, Ta, Ti, W, Ni, and/or Au.

A semiconductor substrate 111 included in the semiconductor device 110d may include, for example, silicon (Si). Alternatively, the semiconductor substrate 111 may include a semiconductor atom such as germanium (Ge) or a compound semiconductor such as SiC (silicon carbide), GaAs (gallium arsenide), InAs (indium arsenide), and InP (indium phosphide). In addition, the semiconductor substrate 111 may include a buried oxide (BOX) layer. The semiconductor substrate 111 may include a conductive region, for example, a well doped with impurities. The semiconductor substrate 111 may have various device isolation structures such as a shallow trench isolation (STI) structure.

A semiconductor device including various types of individual semiconductor devices may be formed in the semiconductor device 110d. The plurality of individual semiconductor devices may include various microelectronic devices, for example, a metal oxide semiconductor field effect transistor (MOSFET) such as a complementary metal insulator semiconductor (CMOS) transistor, etc., an image sensor such as system large scale integration (LSI), a CMOS imaging sensor (CIS), etc., a micro-electromechanical system (MEMS), an active device, a passive device, etc. The plurality of individual semiconductor devices may be electrically connected to the conductive region of the semiconductor substrate 111. The semiconductor device may further include a conductive wiring or a conductive plug electrically connecting at least two of the individual semiconductor devices or the individual semiconductor devices and the conductive region of the semiconductor substrate 111. The plurality of individual semiconductor devices may be electrically separated from other neighboring individual semiconductor devices by one or more insulating layers.

The semiconductor device 110d may be, for example, a memory semiconductor chip. The memory semiconductor chip may be, for example, a volatile memory semiconductor chip such as a Dynamic Random Access Memory (DRAM), a Static Random Access Memory (SRAM), a Phase-change Random Access Memory (PRAM), a Magnetoresistive Random Access Memory (MRAM), a Ferroelectric Random Access Memory (FeRAM) a Resistive Random Access Memory (RRAM), or the like.

The semiconductor devices 110a, 110b, and 110c disposed lower than the semiconductor device 110d. For example, the semiconductor devices 110a, 110b, and 110c may be disposed between the package substrate 120 and the semiconductor device 110d. Each of the semiconductor devices 110a, 110b, and 110c may have a plurality of through electrodes 113 in their respective the semiconductor substrates 111. The plurality of through electrodes 113 may, for example, have a pitch of several tens of μm and a matrix arrangement. The pitch may be a distance from center to center of neighboring through electrodes 113. Each of the plurality of through electrodes 113 may have, for example, a diameter ranging from several μm to several tens of μm. The diameter of each of the plurality of through electrodes 113 may have a value smaller than a pitch at which the plurality of through electrodes 113 are disposed. For example, the plurality of through electrodes 113 may have a diameter ranging from 5 μm to 15 μm and a pitch ranging from 25 μm to 50 μm.

The through electrodes 113 may be formed as through silicon vias (TSV). The through electrodes 113 may include a wiring metal layer and a barrier metal layer surrounding the wiring metal layer. The wiring metal layer may include, for example, Cu or W. For example, the wiring metal layer may include Cu, CuSn, CuMg, CuNi, CuZn, CuPd, CuAu, CuRe, CuW, W, but is not limited thereto. For example, the wiring metal layer may also include Al, Au, Be, Bi, Co, Cu, Hf, In, Mn, Mo, Ni, Pb, Pd, Pt, Rh, Re, Ru, Ta, Te, Ti, W, Zn, and/or Zr and may have a single stack structure or a structure including two or more stacked elements. The barrier metal layer may include W, WN, WC, Ti, TiN, Ta, TaN, Ru, Co, Mn, WN, Ni, and/or NiB, and may have a single layer structure or a multilayer structure. However, materials of the through electrodes 113 are not limited to the above materials.

The barrier metal layer and the wiring metal layer may be formed during a physical vapor deposition (PVD) process or a chemical vapor deposition (CVD) process, but are not limited thereto. A spacer insulating layer may be disposed between the through electrodes 113 and a semiconductor substrate included in each of the plurality of semiconductor devices 110a, 110b, and 110c. The spacer insulating layer may prevent semiconductor devices formed in the plurality of semiconductor devices 110a, 110b, and 110c and the through electrodes 113 from directly contacting each other. The spacer insulating layer may include an oxide layer, a nitride layer, a carbide layer, polymer, or a combination thereof. In an exemplary embodiment of the inventive concept, the CVD process may be used to form the spacer insulating layer. The spacer insulating layer may include an $O_3$/TEOS (ozone/tetra-ethyl ortho-silicate) based high aspect ratio process (HARP) oxide layer formed by a sub atmospheric CVD process.

The through electrodes 113 may directly connect the active surface 119f and a non-active surface 119b of each of the plurality of semiconductor devices 110a, 110b, and 110c, but are not limited thereto. The through electrodes 113 may be formed in a via first structure, a via middle structure, or a via last structure.

A front pad 115a and a rear pad 115b electrically connected to the through electrodes 113 may be respectively formed in the active surface 119f and the non-active surface 119b of each of the plurality of semiconductor devices 110a, 110b, and 110c. The front pad 115a and the rear pad 115b may be formed to correspond to the through electrodes 113 and may be electrically connected to the through electrodes 113. However, connection configurations of the front and rear pads 115a and 115b, and the through electrodes 113 are not limited thereto. The front pad 115a and the rear pad 115b may be formed away from the through electrodes 113 and may be electrically connected to the through electrodes 113 through a rewiring layer. The front pad 115a and the rear pad 115b may be formed according to the JEDEC standard, and each may have a thickness of several hundreds of nm to several μm. The front pad 115a and the rear pad 115b may include Al, Cu, Ta, Ti, W, Ni, and/or Au.

The semiconductor devices 110a, 110b, 110c, and 110d and the package substrate 120 may be electrically connected to each other by connection terminals 117. The connection terminals 117 may include an alloy of tin (Sn) and silver (Ag), and may further include copper (Cu), palladium (Pd), bismuth (Bi), antimony (Sb), etc, as needed. The connection terminals 117 may be solder balls or bumps and may further include a pillar layer including metal such as copper, nickel, and gold as needed.

An underfill fillet 130a may fill a space between the semiconductor device 110a and the package substrate 120. Additional underfill fillets 130a may fill spaces between the semiconductor devices 110b, 110c, and 110d. The underfill fillets 130a may be used, for example, to increase adhesion strength of element components of the plurality of semiconductor devices 110 and/or to help reduce a physical condition the plurality of semiconductor devices 110 from deteriorating due to modification of the element components. In an exemplary embodiment of the inventive concept, the underfill fillets 130a may be provided, for example, to fill a space into which impurities or moisture may be penetrated and prevent an electrical migration of the plurality of semiconductor devices 110.

The underfill fillets 130a may protrude from spaces between the package substrate 120 and the semiconductor devices 110a, 110b, 110c, and 110d, toward outside of side surfaces of the semiconductor devices 110a, 110b, 110c, and 110d. Furthermore, the underfill fillets 130a protruding from between the semiconductor devices 110a, 110b, 110c, and 110d may be integrally continuous, (e.g., connected together as one element).

For example, the underfill fillet 130a protruding from the space between the package substrate 120 and the semiconductor devices 110a and the underfill fillet 130a protruding from the space between the semiconductor device 110a and the semiconductor device 110b may be integrally continuous. The underfill fillet 130a protruding from the space between the semiconductor device 110a and the semiconductor device 110b and the underfill fillet 130a protruding from the space between the semiconductor device 110b and the semiconductor device 110c may also be integrally continuous. The underfill fillet 130a protruding from the space between the semiconductor device 110b and the semiconductor device 110c and the underfill fillet 130a protruding from the space between the semiconductor device 110c and the semiconductor device 110d may also be integrally continuous. In this regard, a phrase that "the underfill fillet 130a is integrally continuous" may mean that the underfill fillet 130a is continuous from one space to another space without a boundary or an interface in the underfill fillet 130a.

Outer surfaces of the underfill fillets 130a, e.g., surfaces protruding toward the outside from side surfaces of the semiconductor devices 110a, 110b, 110c, and 110d, may have a shape where protruding parts toward the outside repeat up and down. In an exemplary embodiment of the inventive concept, the phrase that "the underfill fillet 130a is integrally continuous" may mean that there is no boundary or interface between protruding parts toward the outside. A molding resin 140 surrounding some or all of the semiconductor devices 110a, 110b, 110c, and 110d and the underfill fillets 130a, may be provided on the package substrate 120.

Figure 1B:
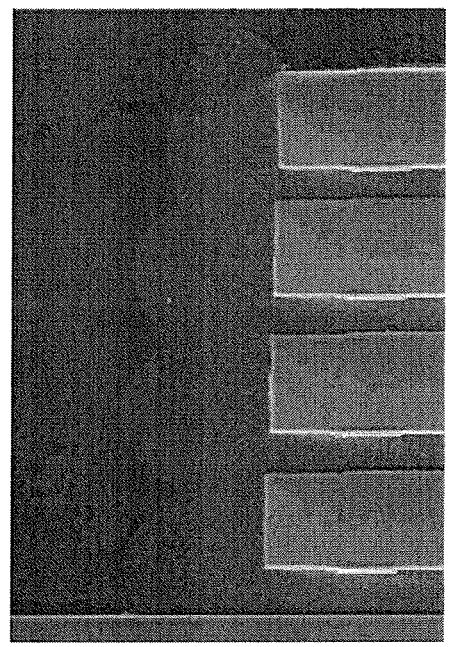
FIG. 1B is a cross-sectional image of an underfill fillet part of a semiconductor package manufactured according to an exemplary embodiment of the inventive concept.
Figure 1C:
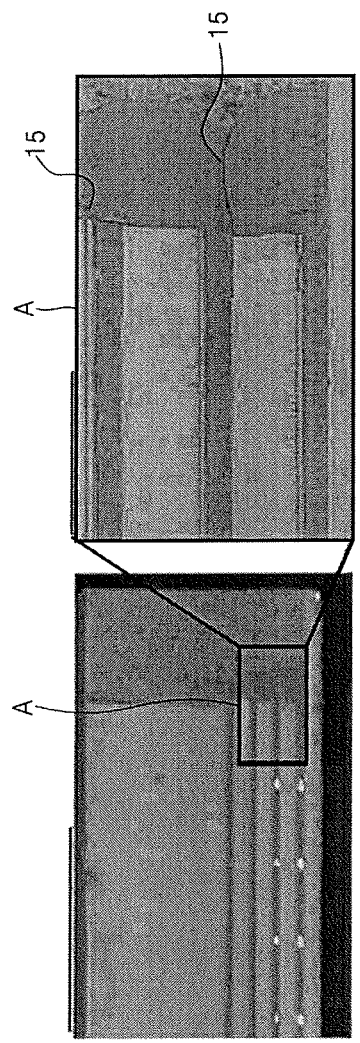
FIG. 1C is a cross-sectional image of a semiconductor package manufactured according to an approach.

FIG. 1B is a cross-sectional image of an underfill fillet part of a semiconductor package manufactured according to an exemplary embodiment of the inventive concept. FIG. 1C is a cross-sectional image of a semiconductor package manufactured according to an approach.

Referring to FIG. 1B, the underfill fillets 130a and a molding resin 140 surrounding the underfill fillets 130a may protrude from in between four stacked semiconductor chips, e.g., the plurality of semiconductor devices 100. Although there may be a clear interface between the underfill fillets 130a and the molding resin 140, no interface is found in between the underfill fillets 130a. For example, the underfill fillets 130a are integrally continuous (e.g., the underfill fillets 130a form one structure).

In FIG. 1C, an area denoted by "A", of a semiconductor chip manufactured according to an approach, has been enlarged. Referring to FIG. 1C, the underfill fillets may protrude from in between the semiconductor chips in a cross-sectional view of the semiconductor package of FIG. 1C. In the enlarged area "A", interfaces 15 may be formed between the plurality of protruding underfill fillets. For example, the underfill fillets are not integral with each other and are not continuous. Thus, the underfill fillets do not form one structure.

The underfill fillets 130 may protrude toward the outside of the side surfaces of the semiconductor devices 110a, 110b, 110c, and 110d due to a manufacturing method that will be described in detail below. Upon briefly describing the manufacturing method, according to an exemplary embodiment of the inventive concept, the semiconductor devices 110a, 110b, 110c, and 110d may have pre-applied underfills, which later protrude to come the underfill fillets 113a. The semiconductor devices 110a, 110b, 110c, and 110d may be provided on the package substrate 120 and may be stacked to manufacture the semiconductor package 100. The pre-applied underfills may include, for example, non-conductive film (NCF). The pre-applied underfills may be temporally coupled depending on adhesion of the NCFs while the connection terminals 117 do not reflow. In some circumstances, the pre-applied underfills may be, for example, non-conductive paste (NCP).

Then, the connection terminals 117 may reflow by applying heat and pressure to the uppermost semiconductor device 110d. The NCFs may gradually become fluid as a temperature increases. As the connection terminals 117 reflow, the spaces between the semiconductor devices 110a, 110b, 110c, and 110d and the space between the semiconductor device 110a and the package substrate 120 may be reduced. Thus, the fluid NCFs of the plurality of semiconductor devices 100 may be partially extruded toward the outside of the semiconductor devices 110a, 110b, 110c, and 110d, and may be disposed on the side surfaces of the semiconductor devices 110a, 110b, 110c, and 110d due to externally applied pressure. This phenomenon may occur in the spaces between the semiconductor devices 110a, 110b, 110c, and 110d and the space between the semiconductor device 110a and the package substrate 120. The NCFs may be extruded from the spaces between the semiconductor devices 110a, 110b, 110c, and 110d and the space between the semiconductor device 110a and the package substrate 120. However, exemplary embodiments of the inventive concept are not limited thereto. As long as the NCFs of different semiconductor devices 100 flow out from spaces between different semiconductor devices 100 or between a semiconductor device 100 and the package substrate 120, and meet each other while in a fluid state, the NCFs may form one continuous structure without interfaces therebetween when cured.

The underfill fillets 130a may be, for example, BPA epoxy resin, BPF epoxy resin, aliphatic epoxy resin, cycloaliphatic epoxy resin, etc. The underfill fillets 130a may further include powder such as silicon carbide, nitride aluminum, etc., as inorganic fillers.

As stated above, the molding resin 140 surrounding some or all of the semiconductor devices 110a, 110b, 110c, and 110d and the underfill fillets 130a, may be provided on the package substrate 120. An interface, or a boundary, may be formed between the molding resin 140 and the underfill fillets 130a. The molding resin 140 may include, for example, an epoxy mold compound (EMC).

In an exemplary embodiment of the inventive concept, the molding resin 140 may expose an upper surface of the uppermost semiconductor device 10d among the plurality of semiconductor devices 110. A heat dissipation member may be attached onto the molding resin 140 and the plurality of semiconductor devices 110 with a thermal interface material (TIM) layer disposed between the heat dissipation member, the molding resin 140 and the plurality of semiconductor devices 110.

The TIM layer may include an insulating material or a material including the insulating material and maintaining an electrical insulation. The TIM layer may include, for example, epoxy resin. In addition, the TIM layer may include, for example, mineral oil, grease, gap filter putty, phase change gel, phase change material pads, or particle filled epoxy.

The heat dissipation member may include, for example, a heat sink, a heat spreader, a heat pipe, or a liquid cooled cold plate.

Figure 2:
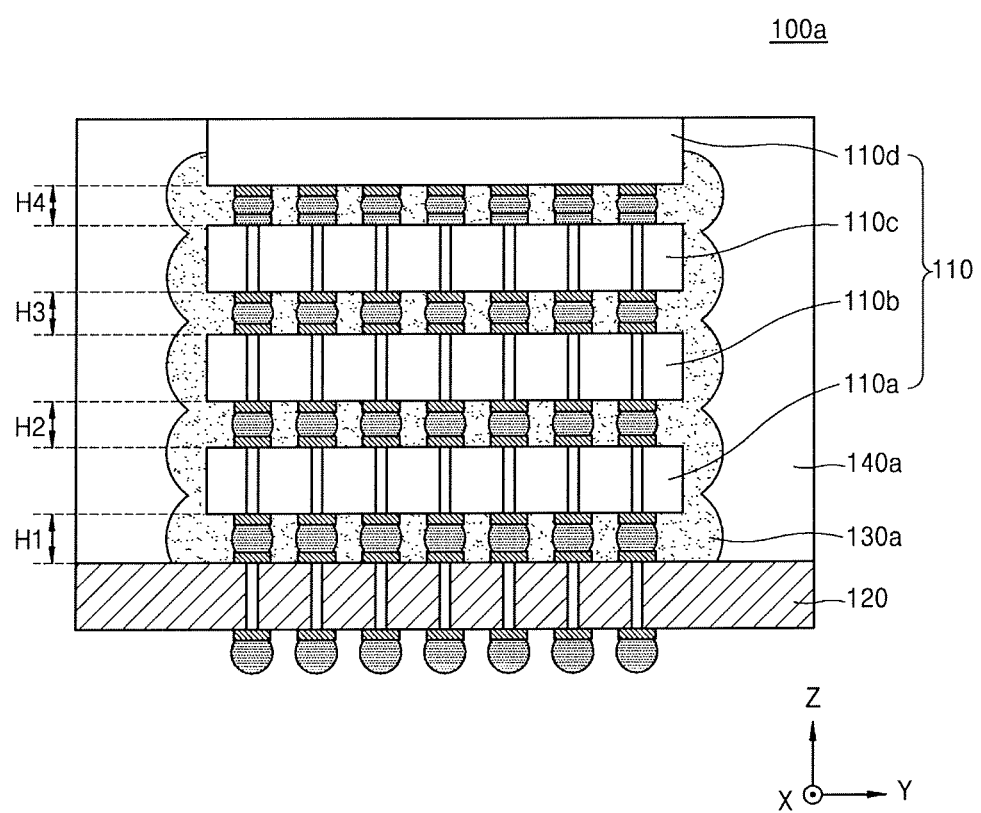
FIGS. 2 through 9 are cross-sectional views of semiconductor packages according to exemplary embodiments of the inventive concepts.

FIG. 2 is a cross-sectional view of a semiconductor package 100a according to an exemplary embodiment of the inventive concept.

Referring to FIG. 2, the underfill fillets 130a, as described with reference to FIG. 1A, may protrude from spaces between the package substrate 120 and the semiconductor devices 110a, 110b, 110c, and 110d to the outside of the semiconductor devices 110a, 110b, 110c, and 110d. The underfill fillets 130a extending from other spaces may also be integrally continuous with those protruding from spaces between the package substrate 120 and the semiconductor devices 110a, 110b, 110c, and 110d.

Intervals H1, H2, H3, and H4 between the package substrate 120 and the semiconductor devices 110a, 110b, 110c, and 110d might not be uniform. In an exemplary embodiment of the inventive concept, the intervals H1, H2, H3, and H4 between the package substrate 120 and the semiconductor devices 110a, 110b, 110c, and 110d may be different from each other. In an exemplary embodiment of the inventive concept, the intervals H1, H2, H3, and H4 between the package substrate 120 and the semiconductor devices 110a, 110b, 110c, and 110d may be reduced farther away from the package substrate 120. For example, the intervals H1, H2, H3, and H4 may have relationships of H1>H2>H3>H4.

The reason why the intervals H1, H2, H3, and H4 may have the relationship of H1>H2>H3>H4 may be the heating for reflowing of an upper surface of the semiconductor device 110d. For example, since the upper surface of the semiconductor device 110d is the surface for example heated, a temperature for example transferred toward the package substrate 120 may be reduced (for example, the temperature becomes lower farther away from the upper surface of the semiconductor device 110d), and a reflow degree may be reduced in proportion to the temperature. A part of a high reflow degree may have the relatively small interval H4, whereas a part of a low reflow degree may have the relatively great interval H1.

In an exemplary embodiment of the inventive concept, the package substrate 120 and the semiconductor devices 110a, 110b, 110c, and 110d may be electrically connected to each other by solder bumps. A thickness of a bonding pad may be uniform with respect to the package substrate 120 and the semiconductor devices 110a, 110b, 110c, and 110d. The intervals H1, H2, H3, and H4 may be directly correlated to a height of the solder bump. Thus, the height of the solder bump may be reduced farther away from the packet substrate 120.

The intervals H1, H2, H3, and H4 may have a value ranging from about 5 μm to about 100 μm. In an example, the intervals H1, H2, H3, and H4 may have a value ranging from about 5 Jill to about 40 μm.

A molding resin 140a surrounding the plurality of semiconductor devices 110a, 110b, 110c, and 110d and the underfill fillet 130a may partly or wholly be provided on the package substrate 120. As shown in FIG. 2, the molding resin 140a may expose an upper surface of the uppermost semiconductor device 110d among the plurality of semiconductor devices 110. This may be achieved by, for example, removing the molding resin 140a until the upper surface of the semiconductor device 110*d* is exposed after the molding resin 140*a* is formed to cover the upper surface of the semiconductor device 110*d*.

A boundary or an interface may be present between the underfill fillet 130*a* and the molding resin 140*a*.

Figure 3:
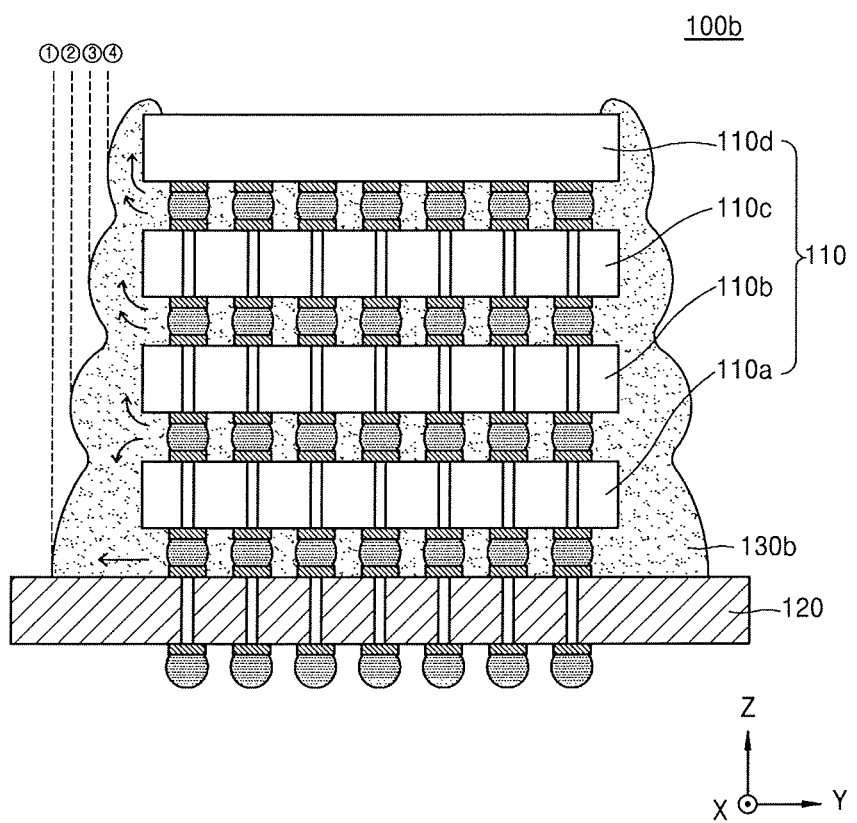

FIG. 3 is a cross-sectional view of a semiconductor package 100*b* according to an exemplary embodiment of the inventive concept.

Referring to FIG. 3, an underfill fillet 130*b*, as described with reference to FIG. 1A, may protrude from spaces between the package substrate 120 and the semiconductor devices 110*a*, 110*b*, 110*c*, and 110*d* to the outside of the semiconductor devices 110*a*, 110*b*, 110*c*, and 110*d*. The underfill fillet 130*b* extending from other spaces may also be integrally continuous with those protruding from spaces between the package substrate 120 and the semiconductor devices 110*a*, 110*b*, 110*c*, and 110*d*.

The underfill fillets 130*b* may have a specially unique cross-sectional shape. As shown in FIG. 3, a predetermined tendency may be present in the underfill fillets 130*b* that protrude from the spaces between the package substrate 120 and the semiconductor devices 110*a*, 110*b*, 110*c*, and 110*d*.

For example, the underfill fillets 130*b* may include a block corresponding to a space between the package substrate 120 and the semiconductor device 110*a*, a block corresponding to a space between the semiconductor devices 110*a* and 110*b*, a block corresponding to a space between the semiconductor devices 110*b* and 110*c*, and a block corresponding to a space between the semiconductor devices 110*c* and 110*d*. As shown in FIG. 3, when locations of upper leading parts of the blocks are sequentially 1, 2, 3, and 4 degrees of protrusion from side surfaces of the semiconductor devices 110*a*, 110*b*, 110*c*, and 110*d* may be in order of 1>2>3>4. For example, a degree of the underfill fillets 130*b* that protrude from each of the spaces may be reduced farther away from the package substrate 120.

In an exemplary embodiment of the inventive concept, the underfill fillets 130*b* may rise higher than an upper surface of the semiconductor device 110*d*. For example, an uppermost level of the underfill fillet 130*b* may be higher than a level of the upper surface of the semiconductor device 110*d*. In this regard, the "level" may mean a distance in a z axis direction with respect to the package substrate 120.

The upper surface of the uppermost semiconductor device 110*d* may be partially coated by an underfill fillet 130*b*. For example, an edge of the upper surface of the semiconductor device 110*d* may be at least partially coated by an underfill fillet 130*b*.

This type of the underfill fillet 130 may be obtained due to a flow profile of a pre-applied underfill that flows during reflow of the connection terminals 117 as shown by the arrows in FIG. 3. For example, a pre-applied underfill present between the package substrate 120 and the semiconductor device 110*a* may protrude the farthest (e.g., degree 1) since the package substrate prevents it from moving down, e.g., in the −z axis direction.

The underfill protruding from the space between the semiconductor devices 110*a* and 110*b* may be protrude relatively less than degree 1 since some of the underfill may flow downward and some upward. An underfill protruding from the space between the semiconductor devices 110*b* and 110*c* may receive a small influence of gravity and may flow in the upward (e.g., +z axis) direction and may protrude less than degree 2. An underfill protruding from the space between the semiconductor devices 110*c* and 110*d* may rise to a high level through the upper surface of the semiconductor device 110*d* since the underfill receives a force from the underfill from below, and may protrude less than degree 3.

Figure 4:
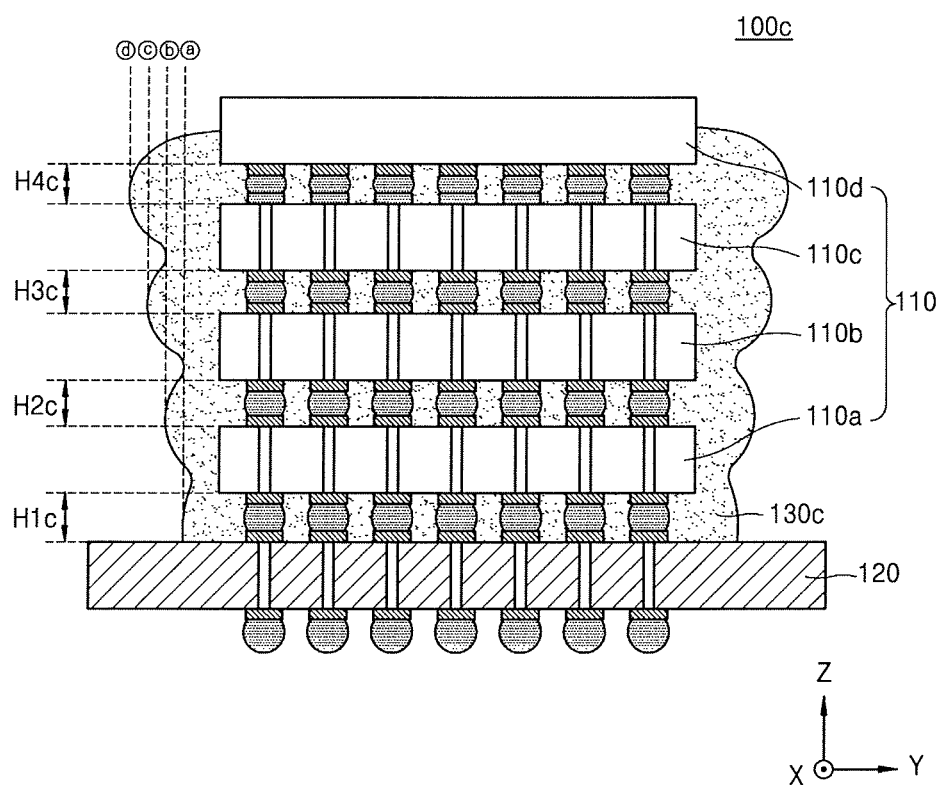

FIG. 4 is a cross-sectional view of a semiconductor package 100*c* according to an exemplary embodiment of the inventive concept.

Referring to FIG. 4, an underfill fillet 130*c*, as described with reference to FIG. 1A, may protrude from spaces between the package substrate 120 and the semiconductor devices 110*a*, 110*b*, 110*c*, and 110*d* to the outside of side surfaces of the semiconductor devices 110*a*, 110*b*, 110*c*, and 110*d*. The underfill fillet 130*c* extending from other spaces may also be integrally continuous with those protruding from spaces between the package substrate 120 and the semiconductor devices 110*a*, 110*b*, 110*c*, and 110*d*.

The underfill fillet 130*c* may have a specially unique cross-sectional shape. As shown in FIG. 4, a predetermined tendency may be present in the underfill fillets 130*c* that protrude from the spaces between the package substrate 120 and the semiconductor devices 110*a*, 110*b*, 110*c*, and 110*d* to the outside of the semiconductor devices 110*a*, 110*b*, 110*c*, and 110*d*.

The underfill fillet 130*c* may include a block corresponding to a space between the package substrate 120 and the semiconductor device 110*a*, a block corresponding to a space between the semiconductor devices 110*a* and 110*b*, a block corresponding to a space between the semiconductor devices 110*b* and 110*c*, and a block corresponding to a space between the semiconductor devices 110*c* and 110*d*. As shown in FIG. 4, the degrees of protrusion of the underfill fillets 130*c* from side surfaces of the semiconductor devices 110*a*, 110*b*, 110*c*, and 110*d* may be in the order of d>c>b>a. For example, a degree of protrusion of each underfill fillet 130*c* may be increased farther away from the package substrate 120.

Furthermore, intervals H1*c*, H2*c*, H3*c*, and H4*c* between the package substrate 120 and the semiconductor devices 110*a*, 110*b*, 110*c*, and 110*d* might not be uniform. In an exemplary embodiment of the inventive concept, the intervals H1*c*, H2*c*, H3*c*, and H4*c* between the package substrate 120 and the semiconductor devices 110*a*, 110*b*, 110*c*, and 110*d* may be different. In an exemplary embodiment of the inventive concept, the intervals H1*c*, H2*c*, H3*c*, and H4*c* between the package substrate 120 and the semiconductor devices 110*a*, 110*b*, 110*c*, and 110*d* may be reduced farther away from the package substrate 120. For example, the intervals H1*c*, H2*c*, H3*c*, and H4*c* may have relationships of H1*c*>H2*c*>H3*c*>H4*c*.

The degree of protrusion d>c>b>a in which the underfill fillets 130*c* protrude from the side surfaces of the semiconductor devices 110*a*, 110*b*, 110*c*, and 110*d* may result from the relationships of H1*c*>H2*c*>H3*c*>H4*c* of the intervals H1*c*, H2*c*, H3*c*, and H4*c*. For example, if it is assumed that thicknesses of pre-applied underfills provided on the semiconductor devices 110*a*, 110*b*, 110*c*, and 110*d* are the same, an underfill having an interval reduction by reflow may protrude most. Accordingly, since the intervals H1*e*, H2*c*, H3*c*, and H4*c* are reduced farther away from the package substrate 120, an amount of fluid and protruded underfill may increase farther away from the package substrate 120.

Cross-sectional shapes formed by the underfill fillets 130*a*, 130*b*, and 130*c* may be influenced by various variables such as a glass transition temperature (Tg) of polymer included in the underfill fillets 130*a*, 130*b*, and 130*c*, viscosity, a curing characteristic, a heating speed, a cooling speed, etc.

Figure 5:
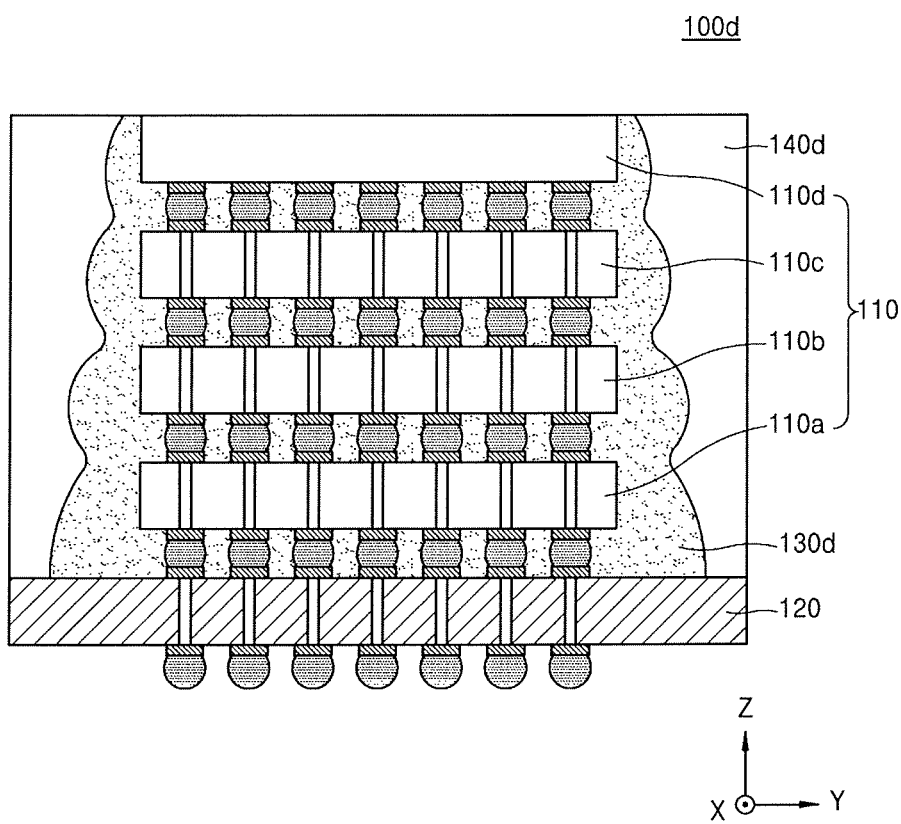

FIG. 5 is a cross-sectional view of a semiconductor package 100d according to an exemplary embodiment of the inventive concept.

Referring to FIG. 5, the underfill fillets 130d, as described with reference to FIG. 1A, may protrude from spaces between the package substrate 120 and the semiconductor devices 110a, 110b, 110c, and 110d to the outside of the semiconductor devices 110a, 110b, 110c, and 110d. The underfill fillets 130d extending from other spaces may also be integrally continuous with those protruding from spaces between the package substrate 120 and the semiconductor devices 110a, 110b, 110c, and 110d.

The underfill fillets 130d may be partially exposed on an upper surface of the semiconductor device 100d. For example, the upper surface of the semiconductor device 100d may be present on substantially the same plane as an upper surface of a molding resin 140d and an uppermost surface of the underfill fillet 130d.

Figure 6:
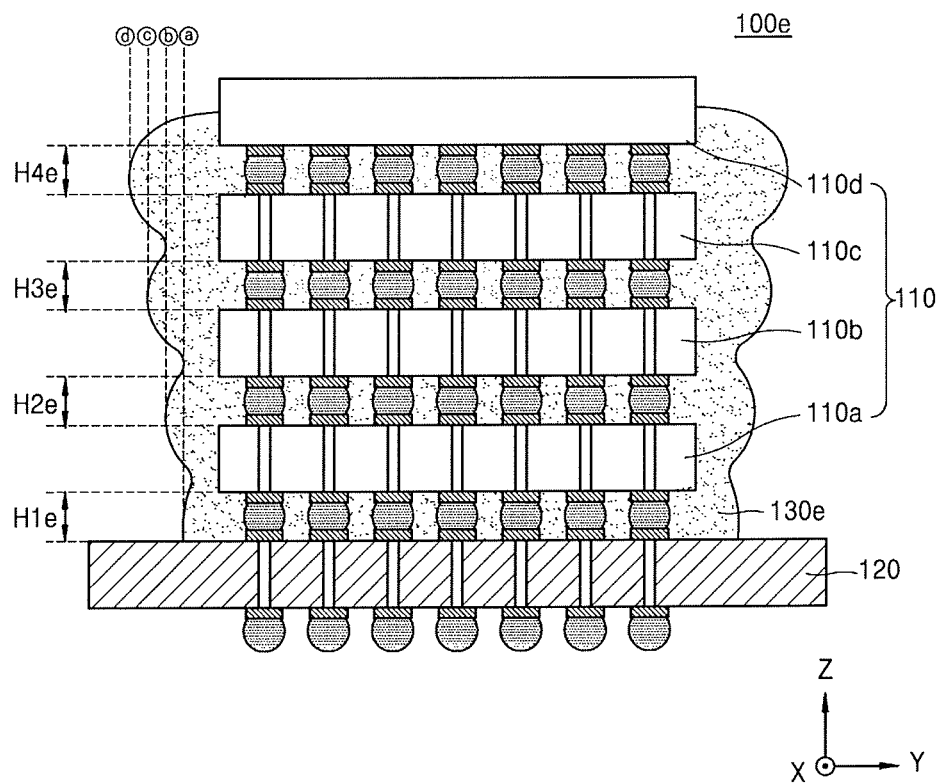

FIG. 6 is a cross-sectional view of a semiconductor package 100e according to an exemplary embodiment of the inventive concept.

Referring to FIG. 6, the underfill fillets 130e, as described with reference to FIG. 1A, may protrude from spaces between the package substrate 120 and the semiconductor devices 110a, 110b, 110c, and 110d to the outside of side surfaces of the semiconductor devices 110a, 110b, 110c, and 110d. The underfill fillet 130e extending from other spaces may also be integrally continuous with those protruding from spaces between the package substrate 120 and the semiconductor devices 110a, 110b, 110c, and 110d.

The semiconductor package of FIG. 6 may be similar to that of FIG. 4 except that in FIG. 6, the intervals H2e, H3e, and H4e of the semiconductor devices 110a, 110b, 110c, and 110d and an interval H1e between the semiconductor device 110a and the package substrate 120 are uniform.

Although the intervals H1e, H2e, H3e, and H4e are the same, a difference of protrusion amount of the underfill fillets 130e may be resulted from a difference in thicknesses of pre-applied underfills attached to the semiconductor devices 110a, 110b, 110c, and 110d. For example, the thicknesses of the pre-applied underfills may be different in consideration of temperature grades of the semiconductor devices 110a, 110b, 110c, and 110d during reflow. For example, a pre-applied underfill having a greater thickness may be applied to the semiconductor device 110d that is expected to have a relatively high temperature, and a pre-applied underfill having a smaller thickness may be applied to the semiconductor device 110a that is expected to have a relatively low temperature. Accordingly, the intervals H1e, H2e, H3e, and H4e between the semiconductor devices 110a, 110b, 110c, and 110d after reflow may be substantially the same.

However, in this case, the amount of protrusion of the underfill fillets 130e may increase in a direction away from the package substrate 120.

Figure 7A:
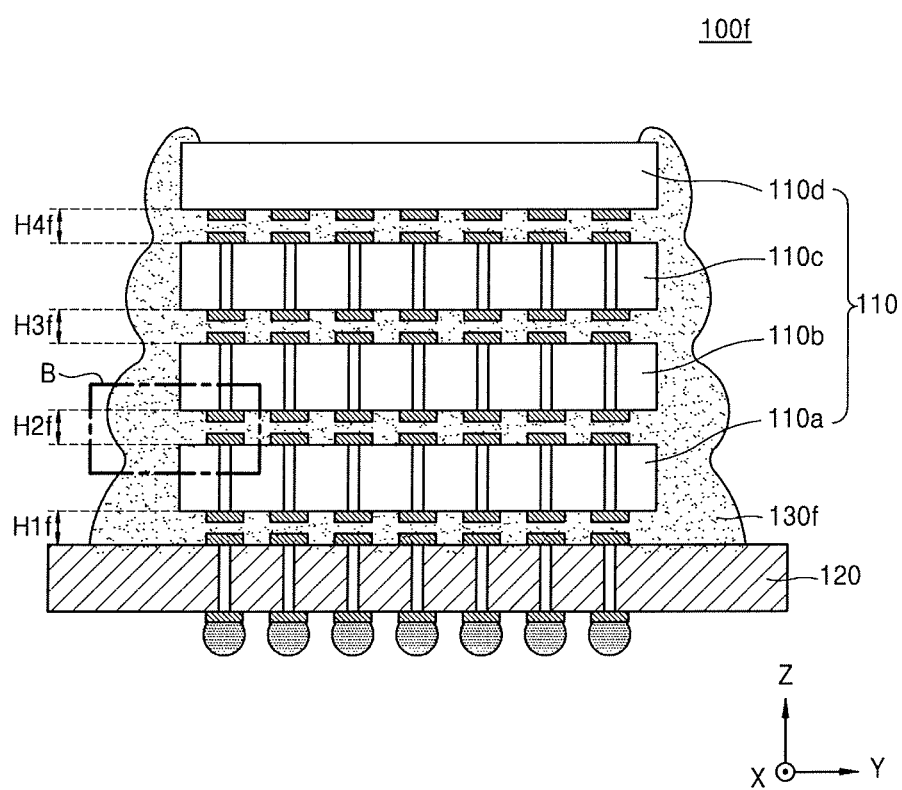
Figure 7B:
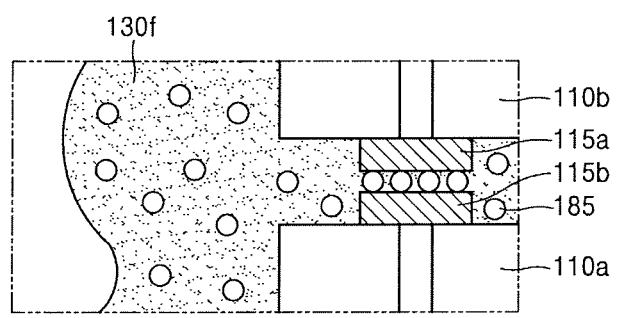

FIG. 7A is a cross-sectional view of a semiconductor package 100f according to an exemplary embodiment of the inventive concept. FIG. 7B is an enlarged part B of FIG. 7A according to an exemplary embodiment of the inventive concept. The molding resin is omitted in FIGS. 7A and 7B for clarity.

In the embodiments of FIGS. 1A and 2 through 6, an NCF may be applied as a pre-applied underfill, and the connection terminals 117 such as solder balls or a bumps may be used for an electrical connection. An anisotropic conductive film (ACF) may be used as the pre-applied underfill in FIGS. 7A and 7B. The ACF in which conductive particles 185 are distributed in a matrix film, and, as shown in FIG. 7B, may attain the electrical connection by creating contact between the conductive particles 185 and the pads 115a and 115b to form a conductive path between the pads 115a and 115b.

Accordingly, a connection terminal such as a solder ball or a bump might not be necessary, and a thin semiconductor package 100f may be manufactured.

Intervals H2f, H3f, and H4f between the semiconductor devices 110a, 110b, 110c, and 110d and an interval H1f between the semiconductor device 110a and the package substrate 120 may be substantially the same. Since reflow of the solder ball or the bump is not necessary, and ACFs of the same thickness may be applied to the semiconductor devices 110a, 110b, 110c, and 110d, the H1f, H2f, H3f, and H4f may be the same or substantially equal to each other.

Figure 8:
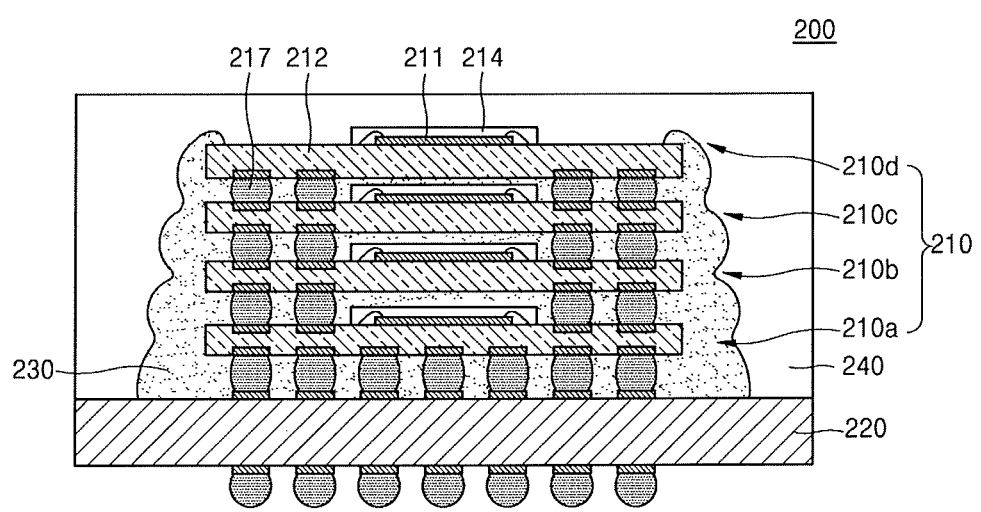

FIG. 8 is a cross-sectional view of a semiconductor package 200 according to an exemplary embodiment of the inventive concept.

Referring to FIG. 8, the semiconductor package 200 may be a package on package (PoP) type semiconductor package in which sub packages 210a, 210b, 210c, and 210d are stacked on the package substrate 220. The package substrate 220 may be substantially the same as the package substrate 120 described with reference to FIG. 1A, and thus a repetitive description thereof is omitted.

Spaces between the sub packages 210a, 210b, 210c, and 210d and between the package substrate 220 and the sub package 210a may be filled by underfill fillets 230. The underfill fillets 230 may protrude from the spaces between the package substrate 220 and the sub packages 210a, 210b, 210c, and 210d to the outside of the sub packages 210a, 210b, 210c, and 210d. Furthermore, the underfill fillets 230 extending from other spaces may be integrally continuous with those extending from the sub packages 210a, 210b, 210c, and 210d.

The underfill fillet 230 extending from the space between the package substrate 220 and the sub package 210a and the underfill fillet 230 extending from the space between the sub packages 210a and 210b may be integrally continuous. The underfill fillet 230 extending from the space between the sub packages 210a and 210b and the underfill fillet 230 extending from the space between the sub packages 210b and 210c may also be integrally continuous. The underfill fillet 230 extending from the space between the sub packages 210b and 210c and the underfill fillet 230 extending from the space between the sub packages 210c and 210d may also be integrally continuous. In this regard, the meaning that "the underfill fillet is integrally continuous" is described with reference to FIG. 1A above, and thus an additional description is omitted.

Outer surfaces of the underfill fillets 230, e.g., surfaces protruding toward the outside from side surfaces of the semiconductor packages 210a, 210b, 210c, and 210d, may have a shape where protruding parts toward the outside repeat up and down.

Each of the sub packages 210a, 210b, 210c, and 210d may include a sub package substrate 212, a semiconductor chip 211 mounted on the sub package substrate 212, a sub molding resin 214 encapsulating the semiconductor chip 211, and a connection terminal 217 for an electrical connection with another semiconductor device. The semiconductor chip 211 may be substantially the same as the semiconductor devices 110 described with reference to FIG. 1A, and thus an additional description thereof is omitted.

Although the sub packages 210a, 210b, 210c, and 210d are the same packages in FIG. 8, different packages types may also be packaged together in the same manner.

The stacked sub packages 210a, 210b, 210c, and 210d and the underfill fillets 230 may be encapsulated by the molding resin 240.

The exemplary embodiments of the inventive concept described with reference to FIGS. 1A and 2 through 8 have no interface or boundary between the underfill fillets. Accordingly, reliability of a semiconductor package is increased. In addition, time and energy spent to manufacture the semiconductor package may be reduced. Thus, throughput is increased and production cost is decreased.

Figure 9:
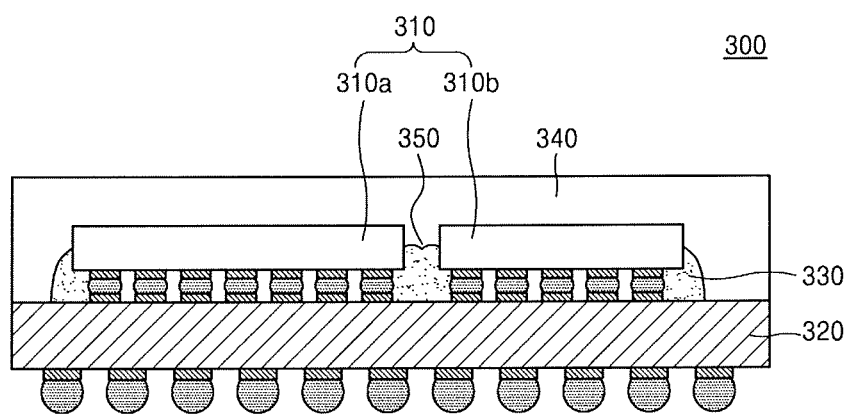

FIG. 9 is a cross-sectional view of a semiconductor package 300 according to an exemplary embodiment of the inventive concept.

Referring to FIG. 9, the semiconductor package 300 may be a semiconductor package in which a plurality of semiconductor devices 310a and 310b are horizontally arranged on a package substrate 320. Although each of the semiconductor devices 310a and 310b is formed as only one layer in FIG. 9, other semiconductor devices may be further stacked on the semiconductor devices 310a and 310b.

The package substrate 320 may be substantially the same as the package substrate 120 described with reference to FIG. 1A, and thus an additional description thereof is omitted. The semiconductor devices 310a and 310b may be substantially the same as the semiconductor devices 110a, 110b, 110c, and 110d of FIG. 1A, and thus additional descriptions thereof are omitted.

An underfill fillet 330 may be integrally continuous between the semiconductor devices 310a and 310b without an interface therebetween. For example, the underfill fillet 330 may be integrally continuous from a lower proton of the semiconductor device 310a to a lower portion of the semiconductor device 310b without the interface. Accordingly, the underfill fillet 330 present between the semiconductor device 310a and the package substrate 320 and the underfill fillet 330 present between the semiconductor device 310b and the package substrate 320 may be integrally continuous.

In an exemplary embodiment of the inventive concept, a concave 350 may be present in the underfill fillet 330 between the semiconductor devices 310a and 310b. This may be generated by simultaneously reflowing a pre-applied underfill attached to a lower portion of the semiconductor device 310a and a pre-applied underfill attached to a lower portion of the semiconductor device 310b. For example, in FIG. 9, the concave 350 may be generated when pre-applied underfill attached to the lower portion of the semiconductor device 310b flows to the left to meet the pre-applied underfill attached to the lower portion of the semiconductor device 310a, which flows to the right.

Similarly to the exemplary embodiments of the inventive concept described with reference to FIGS. 1A and 2 through 8, the semiconductor devices 310a and 310b may be simultaneously bonded onto the package substrate 320 by temporarily attaching the semiconductor devices 310a and 310b onto the package substrate 320 using viscosity of a pre-applied underfill and applying a reflow process as described in the exemplary embodiment of the inventive concept described with reference to FIG. 9.

Accordingly, time and energy spent to manufacture a semiconductor package may be reduced, and reliability of the semiconductor package may be increased since no boundary or interface is present in the underfill fillet 330.

Figure 10:
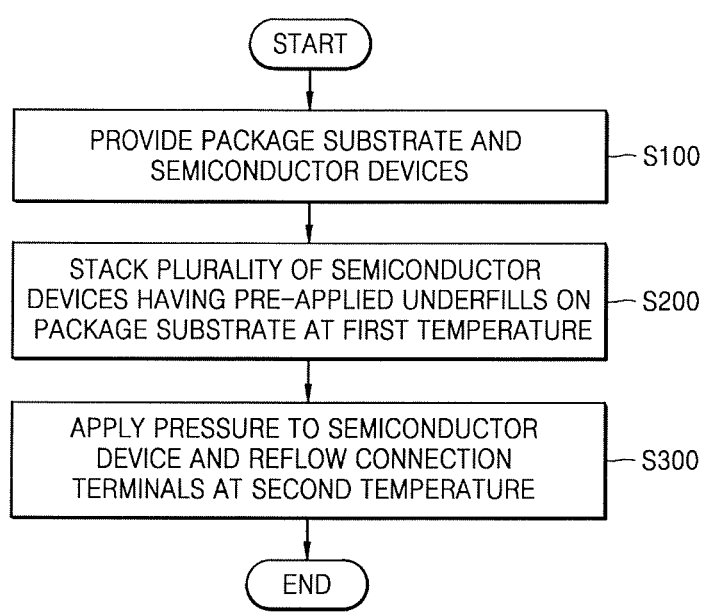
FIG. 10 is a flowchart of a method of manufacturing a semiconductor package according to an exemplary embodiment of the inventive concept.

FIG. 10 is a flowchart of a method of manufacturing a semiconductor package according to an exemplary embodiment of the inventive concept. FIGS. 11A through 11G are cross-sectional views for sequentially illustrating a method of manufacturing a semiconductor package according to an exemplary embodiment of the inventive concept*.

Figure 11A:
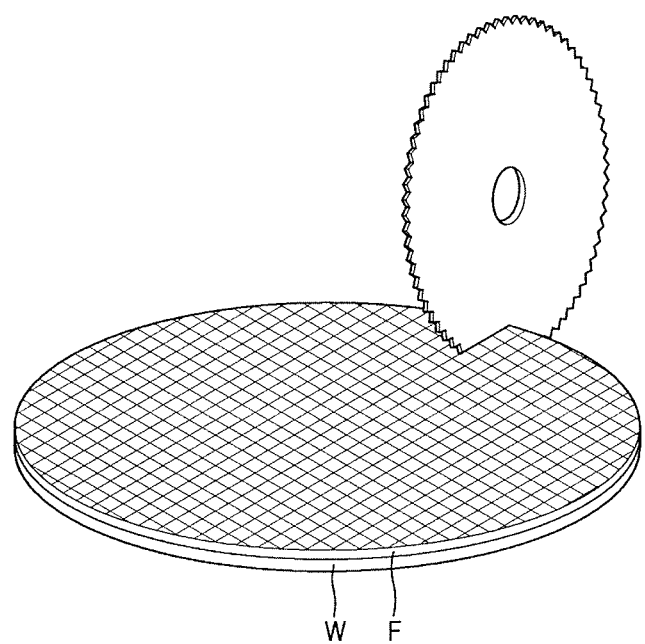
Figure 11B:
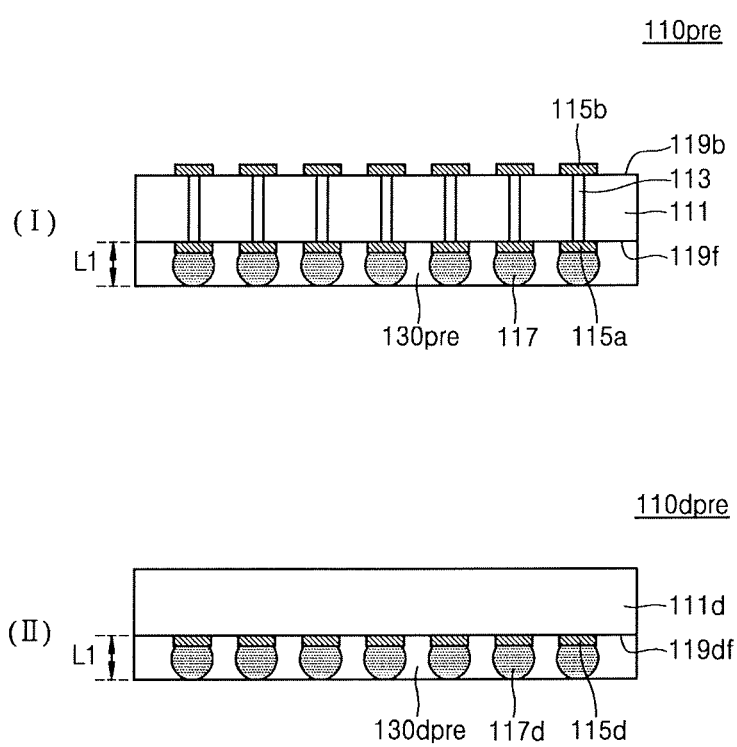

Referring to FIGS. 10, 11A, and 11B, the package substrate 120 (see FIG. 11C) and semiconductor devices 110*pre* and 110*dpre* may be provided (S100).

The package substrate 120 is described in detail with reference to FIG. 1A, and thus an additional description thereof is omitted.

The semiconductor devices 110*pre* and 110*dpre* may be the same as the semiconductor devices 110 described with reference to FIG. 1A except that pre-applied underfills 130*pre* and 130*dpre* including, for example, NCF or ACF, are applied to the semiconductor devices 110*pre* and 110*dpre*.

The pre-applied underfills 130*pre* and 130*dpre* may be provided as wafer levels on an active surface in which semiconductor devices are formed, as shown in FIG. 11A. For example, a film F such as the ACF or the NCF may be attached onto the active surface, may be sawn according to scribe lines, and may be separated into individual semiconductor devices. In an exemplary embodiment of the inventive concept, the semiconductor devices 110*pre* and 110*dpre* may be prepared through such a process.

Although thicknesses of the pre-applied underfills 130*pre* and 130*dpre* and thicknesses of the semiconductor devices 110*pre* and 110*dpre* are the same in FIG. 11B, they may also be different from each other. As described with reference to FIG. 6, the thicknesses of the pre-applied underfills 130*pre* and 130*dpre* may be different so that intervals between the semiconductor devices 110*pre* and 110*dpre* after reflow may be the same or a difference between the intervals is minimized.

Figure 11C:
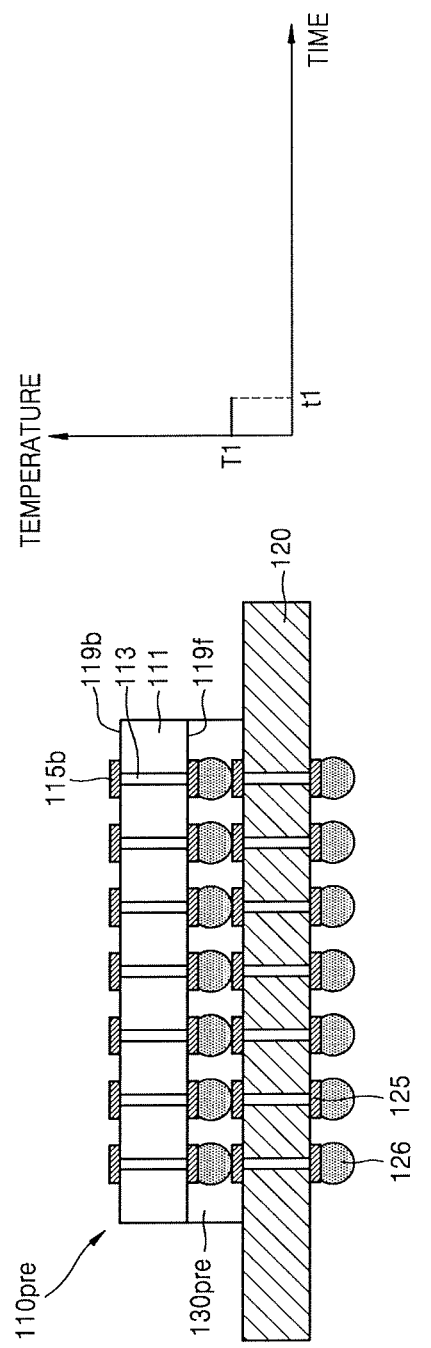

Referring to FIGS. 10 and 11C, the semiconductor device 110*pre* may be stacked on the package substrate 120 (S200). To stack the semiconductor device 110*pre* on the package substrate 120, a temperature of the semiconductor device 110*pre* may rise to a first temperature T1. The first temperature T1 may range, for example, from about 80° C. to about 100° C. However, the inventive concept is not limited thereto.

The temperature of the semiconductor device 110*pre* may rise to the first temperature T1, and thus minor viscosity and fluidity may be formed in the pre-applied underfill 130*pre*, and it may take about a time t1 to attach the semiconductor device 110*pre* to the package substrate 120.

Although the one semiconductor device 110*pre* is attached onto the package substrate 120 in FIG. 11C, the package substrate 120 may be a silicon wafer, and the plurality of semiconductor devices 110*pre* may be attached onto the package substrate 120 at a predetermined interval in a horizontal direction (e.g., the X or Y axis directions).

Figure 11D:
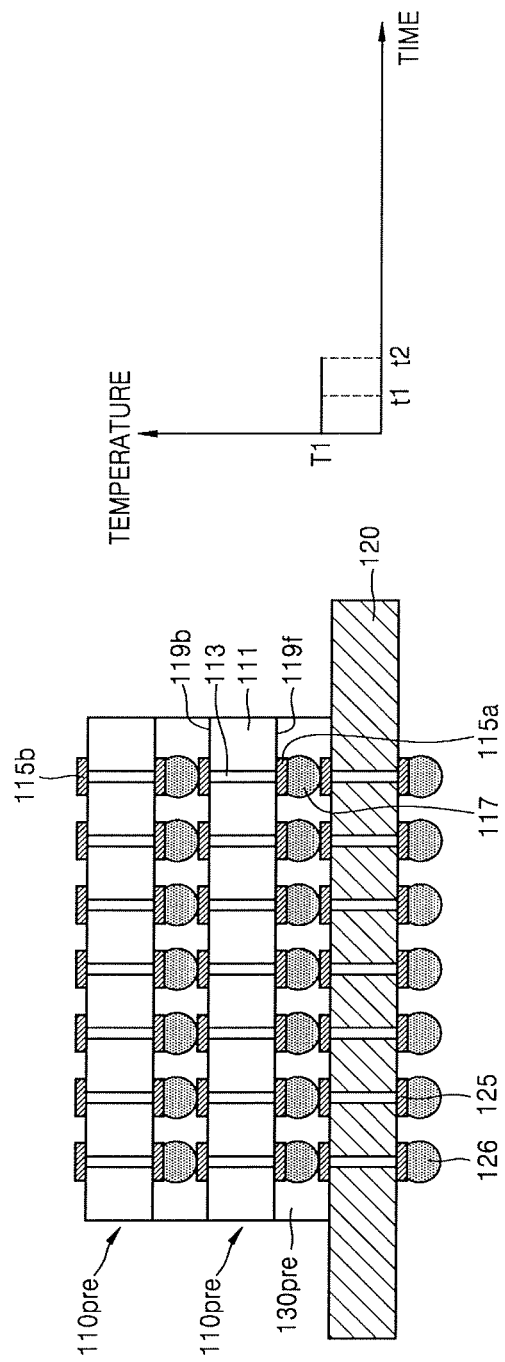

Referring to FIGS. 11D and 11E, additional semiconductor devices 110*pre* may be stacked on the already-stacked semiconductor devices 110*pre* on the package substrate 120. The semiconductor devices 110*pre* may be stacked in the same manner as described with reference to FIG. 11C. However, although the same semiconductor devices 110*pre* may be repeatedly stacked in FIGS. 11D and 11E, different semiconductor devices may be stacked within the scope of the inventive concept.

Individual time taken to stack the additional semiconductor devices 110*pre* may be almost the same or similar as that taken to stack the lowermost semiconductor device 110*pre*.

The semiconductor devices 110*pre* may be coupled with each other depending on viscosity of the pre-applied underfill 130*pre*, as shown in FIG. 11E. Thus, the semiconductor devices 110*pre* might not be firmly coupled at this stage.

Referring to FIG. 11F, the temperature of the uppermost semiconductor device 110dpre may rise from the first temperature T1 to a second temperature T2 while the uppermost semiconductor device 110dpre is attached to the lower semiconductor device 110pre. The second temperature T2 may be a temperature at which reflow is performed, and may range, for example, from about 220° C. to about 280° C.

Figure 11G:
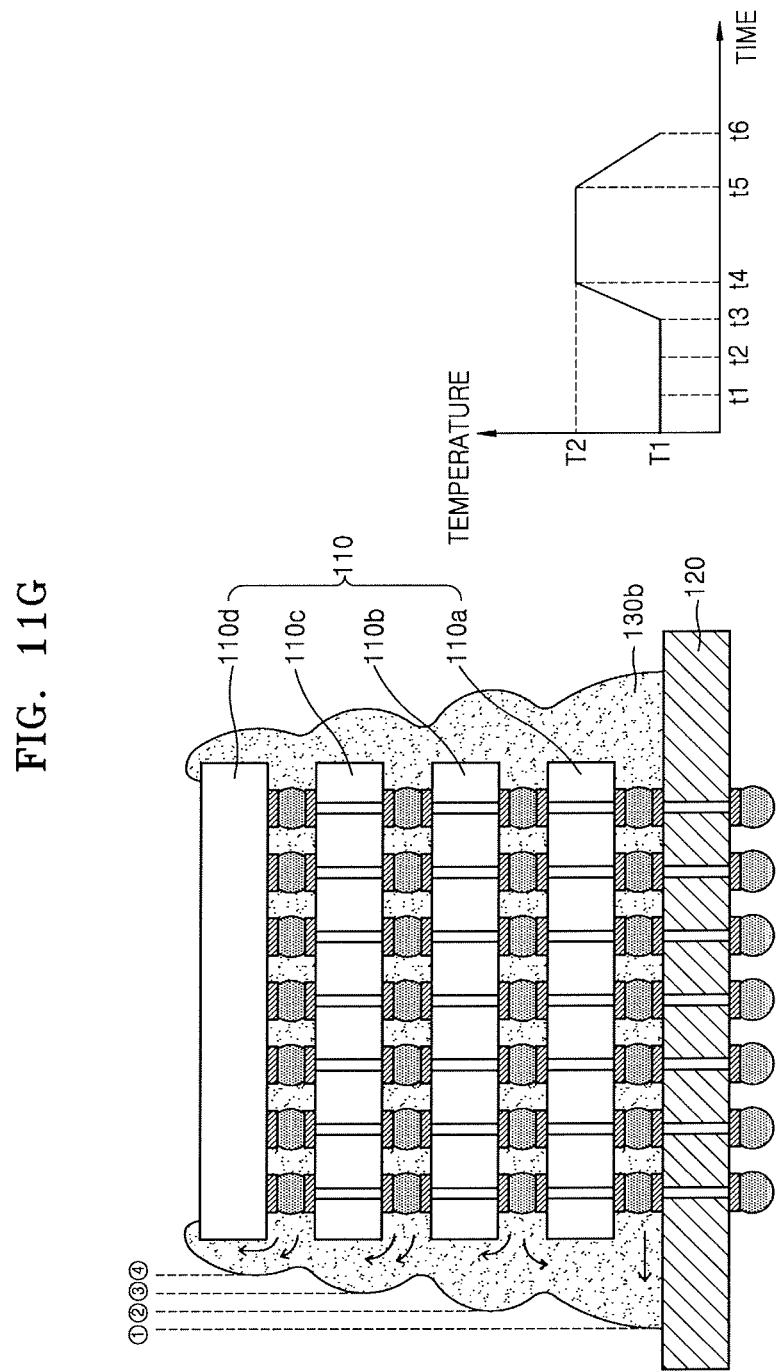

Referring to FIGS. 10 and 11G, if the temperature of the semiconductor device 110d is maintained as the second temperature T2 that a reflow temperature while applying pressure to the semiconductor device 110d, connection terminals may be reflowed (S300). A reflow time may be determined in consideration of the reflow temperature, sizes of the semiconductor devices 110a, 110b, 110c, and 110d, a material and a thickness of a pre-applied underfill, etc.

As described with reference to FIG. 3, the underfill fillet 130b may be formed in a lateral direction by reducing intervals between the semiconductor devices 110a, 110b, 110c, and 110d and an interval between the semiconductor device 110a and the package substrate 120 due to the reflow. A shape of the generated underfill fillet 130b is described in detail with reference to FIGS. 1A and 2 through 9.

The underfill fillets 130b may be cured by stopping heating and pressurizing after reflow is completed and cooling the ambient temperature to the first temperature T1 or another appropriate temperature. The time t6–t5 taken to cool the temperature and cure the underfill fillet 130b may be longer than time t4–t3 taken to rise the temperature to the reflow temperature. For example, a temperature rise may be relatively quick, whereas cooling and curing may take a longer time.

As described above, when the package substrate 120 is a silicon wafer and stack structures of semiconductor devices are disposed in a horizontal direction, all the stack structures of semiconductor devices may be simultaneously molded with molding resin in a manner of manufacturing wafer level packages (WLP). For example, while a plurality of stack structures of semiconductor devices are coupled along a surface of the package substrate 120, the molding resin may be injected into a mold. Thus, the molding resin surrounding the semiconductor devices 110a, 110b, 110c, and 110d and the underfill fillet 130b may be formed.

Then, an individual semiconductor package, as shown in FIG. 1A, may be obtained by dicing the molded stack structures of semiconductor devices.

Figure 12:
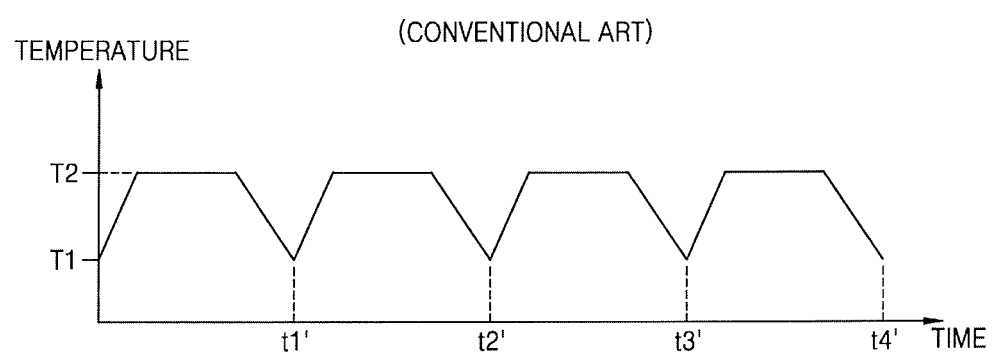
FIG. 12 shows a temperature profile used to manufacture a semiconductor package according to an approach.

FIG. 12 shows a temperature profile used to manufacture a semiconductor package according to an approach. Referring to FIG. 12, a temperature rise and fall/curing temperature are repeated between the first temperature T1 and the second temperature T2 whenever semiconductor devices are stacked on each other. FIG. 12 shows stacking four semiconductor devices, which requires a longer time than a temperature profile shown in FIG. 11G.

According to exemplary embodiments of the inventive concept, semiconductor packages might not include a boundary or an interface in an underfill fillet, and thus a highly reliable semiconductor package may be obtained. According to exemplary embodiments of the inventive concept, semiconductor packages may be manufactured with short time and less energy. This may be due to the lower temperature Ti used to stack the semiconductor packages together and by increasing the temperature to T2 once per semiconductor package to melt or merge all the protruding underfill fillets together. Thus, no boundary might exist between the neighboring underfill fillets. As a result, throughput is increased and a manufacturing cost is reduced. According to exemplary embodiments of the inventive concept, the semiconductor package may be included in a digital media player, a solid state disk (SSD), a motor vehicle, a liquid crystal display (LCD) or a graphics processing unit (GPU).

Figure 13:
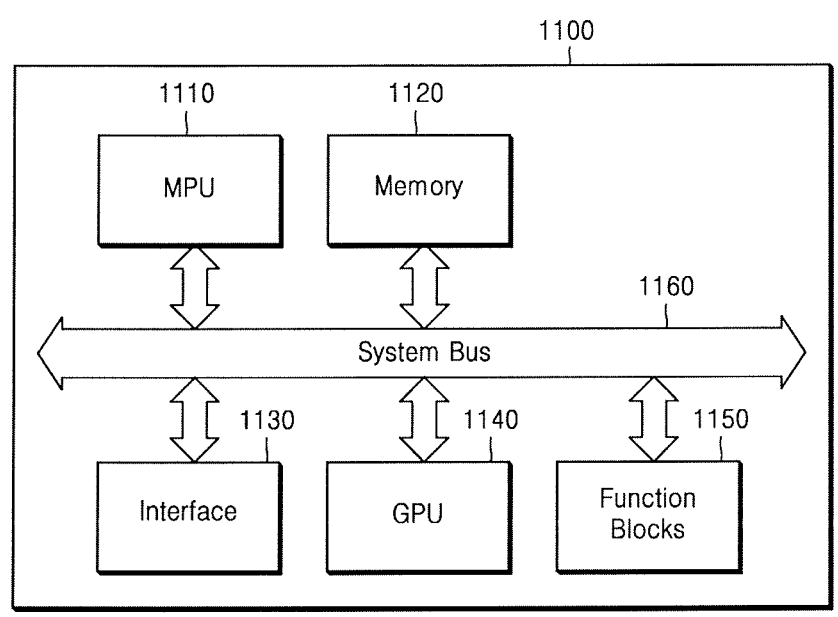
FIG. 13 is a diagram illustrating a structure of a semiconductor package according to an exemplary embodiment of the inventive concept.

FIG. 13 is a diagram illustrating a structure of a semiconductor package 1100 according to an exemplary embodiment of the inventive concept.

Referring to FIG. 13, the semiconductor package 1100 may include a micro processing unit (MPU) 1110, a memory 1120, an interface 1130, a graphic processing unit (GPU) 1140, functional blocks 1150, and a bus 1160 connecting these elements to each other. The semiconductor package 1100 may include both the MPU 1110 and the GPU 1140 or may include only one of the MPU 1110 and the GPU 1140.

The MPU 1110 may include a core and an L2 cache. Further, the MPU 1110 may include a plurality of cores, e.g., multi-cores. Performances of the multi-cores may be the same as or different from each other. The multi-cores may be activated at the same time or at different points of time. The memory 1120 may store results of processes performed in the function blocks 1150, under the control of the MPU 1110. For example, as contents stored in the L2 cache of the MPU 1110 is flushed, the memory 1120 may store the results of processes that are performed in the function blocks 1150. The interface 1130 may interface with external devices. For example, the interface 1130 may interface with a camera, a liquid crystal display (LCD), a speaker, or the like.

The GPU 1140 may perform graphic functions. For example, the GPU 1140 may perform video codec or process three-dimensional (3D) graphics.

The function blocks 1150 may perform various functions. For example, when the semiconductor package 1100 is an access point (AP) for use in mobile devices, some of the function blocks 1150 may perform a communication function.

The memory 1120 may correspond to at least one of the semiconductor packages 100, 100a, 100b, 100c, 100d, 100e, 100f, 200, and 300 of FIGS. 1A and 2 through 9. The semiconductor package 1100 may include at least one of the semiconductor packages 1100, 100a, 100b, 100c, 100d, 100e, 100f, 200, and 300 of FIGS. 1A and 2 through 9.

Figure 14:
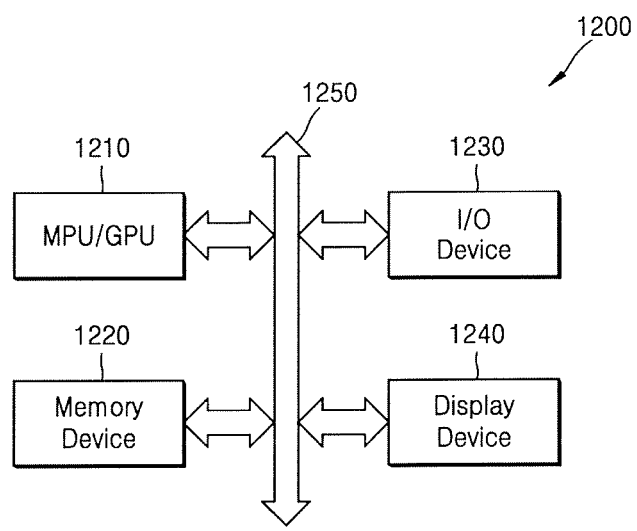
FIG. 14 is a diagram illustrating an electronic system including a semiconductor package according to an exemplary embodiment of the inventive concept.

FIG. 14 is a diagram illustrating an electronic system 1200 including a semiconductor package according to an exemplary embodiment of the inventive concept.

Referring to FIG. 14, the electronic system 1200 may include an MPU/GPU 1210. The electronic system 1200 may be, for example, a mobile device, a desktop computer, or a server. The electronic system 1200 may further include a memory device 1220, an input/output (I/O) device 1230, and a display device 1240, each of which may be electrically connected to a bus 1250.

The memory device 1220 may correspond to at least one of the semiconductor packages 1100, 100a, 100b, 100c, 100d, 100e, 100f, 200, and 300 of FIGS. 1A and 2 through 9. The MPU/GPU 1210 and the memory device 1220 may include at least one of the semiconductor packages 100, 100a, 100b, 100c, 100d, 100e, 100f, 200, and 300 of FIGS. 1A and 2 through 9.

The electronic system 1200 may include the MPU/GPU 1210 and the memory device 1220 that have thickness decreased, internal wirings simplified, or thickness decreased. Thus, the electronic system 1200 may be thinner and lighter and may also have increased reliability.

Figure 15:
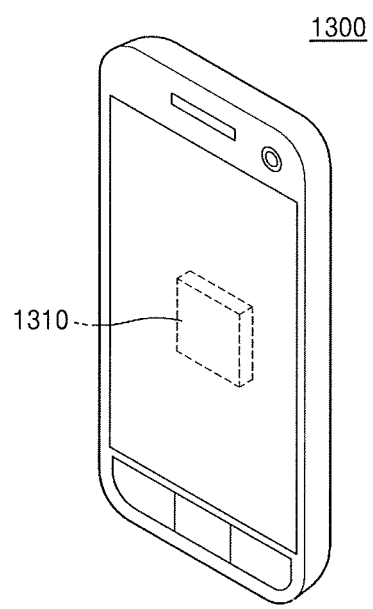
FIG. 15 is a perspective view illustrating an electronic device to which a semiconductor package, manufactured according to an exemplary embodiment of the inventive concept, is applied.

FIG. 15 is a perspective view illustrating an electronic device to which a semiconductor package, manufactured according to an exemplary embodiment of the inventive concept, is applied.

FIG. 15 illustrates an example in which the electronic system 1200 of FIG. 14 may be applied to a mobile phone 1300. The mobile phone 1300 may include a semiconductor package 1310. The semiconductor package 1310 may be any of the semiconductor packages 100, 100a, 100b, 100c, 100d, 100e, 100f, 200, and 300 of FIGS. 1A and 2 through 9.

The mobile phone 1300 may include the semiconductor package 1310 that may have thickness decreased, internal wirings simplified, or length decreased and may be thinner and lighter. Thus, the mobile phone 1300 may have a small size and may have a high performance.

In addition, the electronic system 1200 may be used in a portable laptop, an MPEG-1 and/or MPEG-2 Audio Layer III (MP3) player, navigation, a solid state disk (SSD), a motor vehicle, or a household appliance.

While the inventive concept has been particularly shown and described with reference to exemplary embodiments thereof, it will be apparent to those of ordinary skill in the art that various changes in form and detail may be made therein without departing from the spirit and scope of the inventive concept.

What is claimed is:

1. A semiconductor package, comprising:
    a package substrate;
    a plurality of semiconductor devices stacked on the package substrate;
    a plurality of underfill fillets disposed between the plurality of semiconductor devices and between the package substrate and the plurality of semiconductor devices; and
    a molding resin at least partially surrounding the plurality of semiconductor devices and the plurality of underfill fillets,
    wherein the plurality of underfill fillets include a plurality of protrusions that protrude from spaces between each of the plurality of semiconductor devices or between the package substrate and each of the plurality of semiconductor devices,
    wherein at least two neighboring underfill fillet protrusions of the plurality of protrusions form one continuous structure without an interface therebetween,
    wherein each of the plurality of protrusions has a convex surface, and
    wherein intervals between the plurality of semiconductor devices, and between the package substrate and the plurality of semiconductor devices get smaller for semiconductor devices further away from the package substrate.

2. The semiconductor package of claim 1, wherein the semiconductor package is included in a digital media player, a solid state disk (SSD), a motor vehicle, a liquid crystal display (LCD) or a graphics processing unit (GPU).

3. The semiconductor package of claim 1, wherein an interface is present between the plurality of underfill fillets and the molding resin.

4. The semiconductor package of claim 1, wherein a length of each protrusion of each of the plurality of underfill fillets gets smaller for underfill fillets further away from the package substrate.

5. The semiconductor package of claim 4, wherein a height of one of the plurality of underfill fillets is greater than or equal to a height of an upper surface of an uppermost semiconductor device of the plurality of semiconductor devices, wherein the height of the upper surface of the uppermost semiconductor device of the plurality of semiconductor devices and the height of the one of the plurality of underfill fillets are each measured perpendicularly with respect to a surface of the package substrate.

6. The semiconductor package of claim 4, wherein the upper surface of the uppermost semiconductor device of the plurality of semiconductor devices is coplanar with an upper surface of the molding resin at a first plane, and wherein the plurality of underfill fillets are partially exposed at the first plane.

7. The semiconductor package of claim 1, wherein a length of each protrusion of each of the plurality of underfill fillets gets larger for underfill fillets further away from the package substrate.

8. The semiconductor package of claim 1, wherein intervals between the plurality of semiconductor devices, and between the package substrate and the plurality of semiconductor devices, are substantially equal to each other.

9. The semiconductor package of claim 1, wherein the plurality of underfill fillets include a non-conductive film (NCF), a non-conductive paste (NCP), or an anisotropic conductive film (ACF).

10. The semiconductor package of claim 1, wherein the plurality of semiconductor devices are sub-packages, wherein at least one of the plurality of semiconductor devices comprises a semiconductor chip, and wherein the semiconductor package is a package-on-package (PoP) type of package.

11. A semiconductor package, comprising:
    a package substrate;
    a plurality of semiconductor devices stacked on the package substrate;
    a plurality of underfill fillets disposed between the plurality of semiconductor devices and between the package substrate and the plurality of semiconductor devices; and
    a molding resin at least partially surrounding the plurality of semiconductor devices and the plurality of underfill fillets,
    wherein the plurality of underfill fillets include a plurality of protrusions that protrude from spaces between each of the plurality of semiconductor devices or between the package substrate and each of the plurality of semiconductor devices,
    wherein at least two neighboring underfill protrusions of the plurality of protrusions form one continuous structure without an interface therebetween,
    wherein each of the plurality protrusions has a convex surface,
    wherein intervals between the plurality of semiconductor devices, and between the package substrate and the plurality of semiconductor devices, are substantially equal to each other, and
    wherein a length of each protrusion of each of the plurality of underfill fillets gets larger for underfill fillets further away from the package substrate.

12. A semiconductor package, comprising:
    a package substrate;
    a plurality of semiconductor devices stacked on the package substrate;
    a plurality of underfill fillets disposed between the plurality of semiconductor devices and between the package substrate and the plurality of semiconductor devices; and
    a molding resin surrounding the plurality of semiconductor devices and the plurality of underfill fillets,
    wherein intervals between the plurality of semiconductor devices, and between the package substrate and the plurality of semiconductor devices get smaller for semiconductor devices further away from the package substrate.

13. The semiconductor package of claim 12, wherein at least two adjacent underfill fillets of the plurality of underfill fillets protrude from between two neighboring semiconductor devices and the package substrate or from between three sequentially stacked semiconductor devices, and wherein the at least two adjacent underfill fillet protrusions form an integrally continuous structure.

14. The semiconductor package of claim 12, wherein the plurality of semiconductor devices and the package substrate are electrically connected to each other via a plurality of solder bumps, and wherein a height of a first solder bump of the plurality of first solder bumps disposed at a first vertical height with respect to a surface of the package substrate is greater than a height of a second solder bump of the plurality of solder bumps disposed at a second vertical height with respect to the surface of the package substrate, wherein the first vertical height is smaller than the second vertical height.

15. A semiconductor package, comprising:
a package substrate;
a first semiconductor device and a second semiconductor device stacked on the package substrate, wherein the first semiconductor device is disposed between the package substrate and the second semiconductor device;
a first underfill fillet disposed between the package substrate and the first semiconductor device and a second underfill fillet disposed between the first semiconductor device and the second semiconductor device; and
a molding resin covering at least a part of each of the first and second underfill fillets,
wherein the first underfill fillet protrudes from an area between the package substrate and the first semiconductor device, the second underfill fillet protrudes from an area between the first semiconductor device and the second semiconductor device, wherein the protrusion of the first underfill fillet forms one continuous structure with the protrusion of the second underfill fillet,
wherein a first spacing between the package substrate and the first semiconductor device is larger than or equal to a second spacing between the first semiconductor device and the second semiconductor device,
wherein the first and second spacings are measured along a first direction perpendicular to a surface of the package substrate, and
wherein the protrusion of the first underfill fillet is shorter than the protrusion of the second underfill fillet in a second direction that crosses the first direction.

16. The semiconductor package of claim 15, wherein the first spacing between the package substrate and the first semiconductor device is equal to the second spacing between the first semiconductor device and the second semiconductor device.

17. The semiconductor package of claim 15, wherein the first spacing between the package substrate and the first semiconductor device is larger than the second spacing between the first semiconductor device and the second semiconductor device.

18. The semiconductor package of claim 15, wherein the protrusion of the first underfill fillet is longer than the protrusion of the second underfill fillet in a direction away from an edge of the first semiconductor device and parallel to a surface of the package substrate facing the first semiconductor device.

19. The semiconductor package of claim 15, wherein the protrusion of the first underfill fillet is substantially equal to the protrusion of the second underfill fillet in a direction away from an edge of the first semiconductor device and parallel to a surface of the package substrate facing the first semiconductor device.

* * * * *